(12) United States Patent
Maier

(10) Patent No.: US 8,547,675 B2
(45) Date of Patent: Oct. 1, 2013

(54) SOLID STATE POWER CONTROLLER WITH LIGHTNING PROTECTION

(75) Inventor: Josef Maier, Munningen (DE)

(73) Assignee: Hamilton Sundstrand Corporation, Rockford, IL (US)

( * ) Notice: Subject to any disclaimer, the term of this patent is extended or adjusted under 35 U.S.C. 154(b) by 1776 days.

(21) Appl. No.: 11/593,736

(22) Filed: Nov. 7, 2006

(65) Prior Publication Data

US 2008/0106152 A1  May 8, 2008

(51) Int. Cl.
*H02H 9/02* (2006.01)

(52) U.S. Cl.
USPC ...................................................... 361/93.1

(58) Field of Classification Search
USPC ...................................................... 361/93.1
See application file for complete search history.

(56) References Cited

U.S. PATENT DOCUMENTS

| | | | |
|---|---|---|---|
| 5,189,589 A * | 2/1993 | Marschall .................... | 361/93.2 |
| 5,440,441 A | 8/1995 | Ahuja | |
| 5,723,915 A * | 3/1998 | Maher et al. .................. | 307/131 |
| 6,043,965 A * | 3/2000 | Hazelton et al. .............. | 361/84 |
| 6,225,797 B1 | 5/2001 | Willis et al. | |
| 6,792,338 B2 | 9/2004 | Johnson | |
| 7,099,135 B2 * | 8/2006 | Ball et al. ..................... | 361/93.9 |
| 2004/0246642 A1 * | 12/2004 | Ball ............................... | 361/93.1 |
| 2005/0063154 A1 * | 3/2005 | Pleines et al. ................ | 361/690 |
| 2007/0008747 A1 * | 1/2007 | Soldano et al. .............. | 363/21.04 |

FOREIGN PATENT DOCUMENTS

| | | |
|---|---|---|
| EP | 0474611 | 3/1992 |
| EP | 1298770 | 4/2003 |
| JP | 04316721 A * | 11/1992 |
| WO | 9859420 | 12/1998 |

* cited by examiner

*Primary Examiner* — Rexford Barnie
*Assistant Examiner* — Ann Hoang
(74) *Attorney, Agent, or Firm* — Carlson, Gaskey & Olds P.C.

(57) ABSTRACT

A method of controlling a solid state power controller includes determining whether a voltage across a switch of the solid state power controller is within a predetermined voltage threshold. If the voltage is outside of the predetermined voltage threshold, the current is limited to a non-zero current. As result of this method a SSPC in Offstate stays off and a SSPC in Onstate stays on during lightning events.

18 Claims, 2 Drawing Sheets

SOLID STATE POWER CONTROLLER WITH LIGHTNING PROTECTION

BACKGROUND OF THE INVENTION

This invention relates to vehicle power systems and, more particularly, to solid state power controls.

Vehicles, such as aircraft, typically utilize one or more power distribution units to distribute power from a primary power source to various vehicle systems. The solid state power controls in a power distribution unit typically include an electronic switch and electronic circuitry that provides wiring protection. The switch and circuitry are often referred to as a solid state power controller ("SSPC"). The SSPC has found widespread use because of its desirable status capability, reliability, and packaging density. A typical power distribution unit may include hundreds or thousands of SSPCs.

SSPCs also must operate in the presence of lightning, which can adversely impact electronic devices. Traditionally, aircraft had an aluminum skin that attenuated the lightning current induced on the wires. Some aircraft now use composite materials instead of aluminum for weight and strength benefits. However, composite materials do not provide the same level of attenuation to lightning as aluminum. When lightning occurs, hundreds of volts may surge between a load in the vehicle system and the aircraft chassis. As such, the lightning requirements of SSPCs have increased.

The increase in lightning levels poses a significant additional burden because the SSPC does not provide galvanic isolation in the off state, as would a typical electromechanical circuit for example. Instead, the SSPC uses the electronic switch for switching and an electronic control circuit to provide the circuit breaker function. If the SSPC is in an off state when lightning strikes, the large voltage potential will undesirably increase the voltage across the switch. An over-voltage clamp can be used to protect the switch from exceeding its maximum voltage capability. However, the increased power dissipation of the switch limits the amount of lightning energy that can be dissipated. Alternatively, high voltage FETs may be used to block the voltage in the off state, transient suppression devices can be placed across the FETs or more parallel FETs may be added, but these solutions are expensive, require larger packaging, and reduce reliability. If the SSPC is on when lightning strikes, the large voltage potential increases the current through the switch until the SSPC trips to the off state and dissipate the lightning energy as above. Tripping to the off state when lightning strikes is undesirable because current to the load is interrupted. In particular during a lightning strike the major number of SSPC's connected to an affected wire bundle potentially could trip off, thus resulting in the loss of a significant number of loads.

There is a need for a simple, relatively inexpensive SSPC with improved lightning protection that avoids interruption of current when lightning strikes. This invention addresses those needs while avoiding the shortcomings and drawbacks of the prior art.

SUMMARY OF THE INVENTION

An example method of controlling a solid state power controller (SSPC) includes determining whether a voltage across a switch of the SSPC is within a predetermined voltage threshold, such as a normal bus voltage of the SSPC. If the voltage is outside of the predetermined voltage threshold, the current is actively limited by the SSPC to a non-zero current such that current to the load is not interrupted by the lightning strike.

An example solid state power controller system includes a switch that normally operates within the predetermined voltage threshold, a microcontroller that controls the switch, and a current limit module that also controls the switch. The current limit module selectively limits the current through the switch when a voltage across the switch is outside of the predetermined voltage threshold.

BRIEF DESCRIPTION OF THE DRAWINGS

The various features and advantages of this invention will become apparent to those skilled in the art from the following detailed description of the currently preferred embodiment. The drawings that accompany the detailed description can be briefly described as follows.

DETAILED DESCRIPTION OF THE PREFERRED EMBODIMENT

Figure 1:
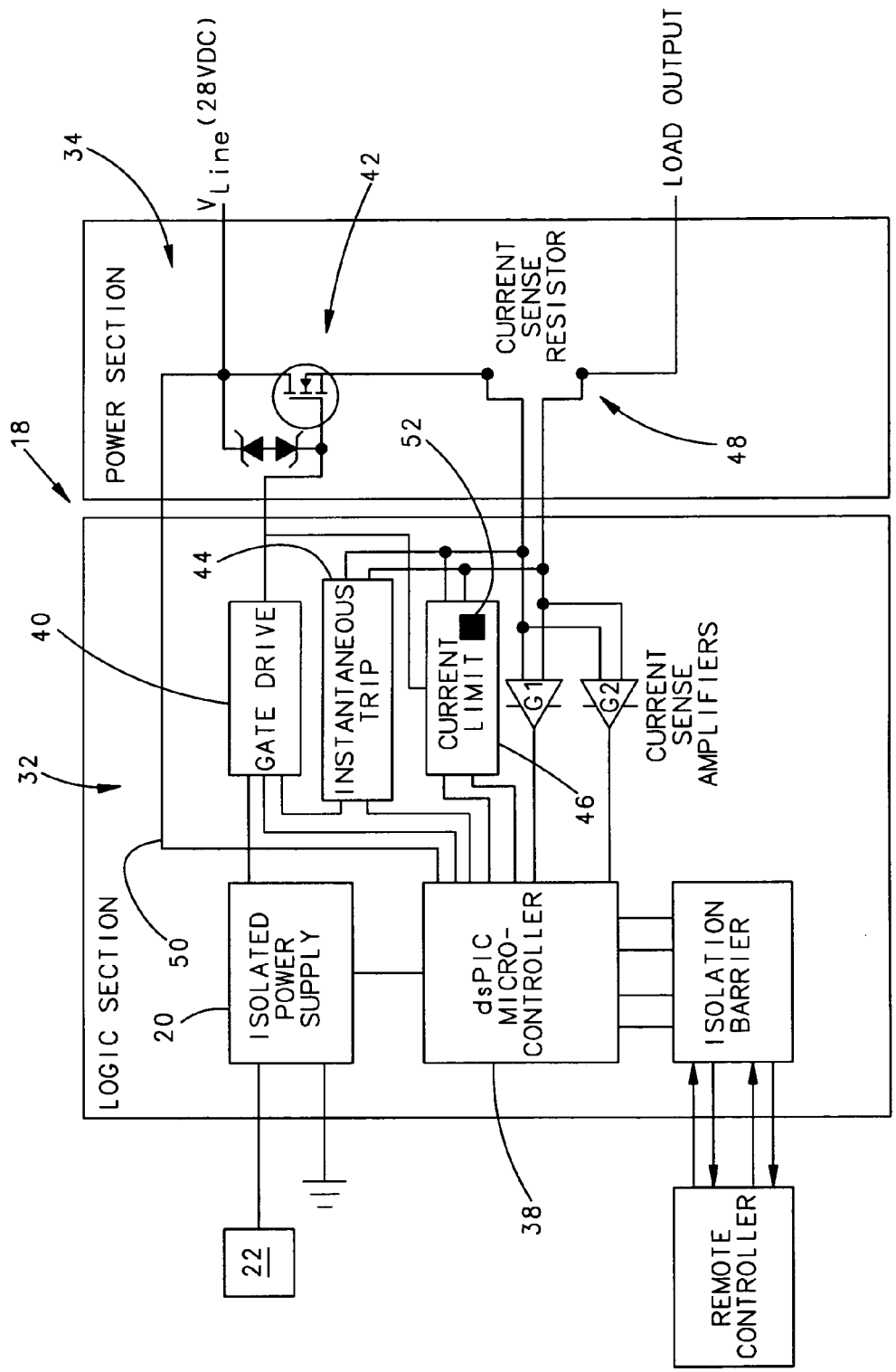
FIG. 1 illustrates selected portions of an example solid state power controller with lightning protection.

FIG. 1 illustrates selected portions of an example solid state power controller (SSPC) 18 for use in a vehicle, such as an aircraft. Under some conditions, such as a lightning strike, a transient current may surge through the vehicle. The transient current may be, for example, an induced current, other known type of transient current, or a transient current from another source besides lightning. In the disclosed example, the SSPC 18 provides lightning protection to reduce the risk that the SSPC 18 becomes damaged from the transient current and prevent the SSPC 18 from tripping off when lightning strikes. Using high voltage FET's with a blocking voltage higher than the lightning strike induced voltage will also allow a SSPC in offstate to stay off, rather than bypassing the voltage through its voltage clamp. As will be appreciated from the illustration and the following description, the SSPC 18 of the disclosed examples provides lightning protection without significant packaging density, reliability, or cost penalty. Although the SSPC 18 is a direct current type in the disclosed examples, one of ordinary skill in the art who has the benefit of this disclosure will recognize that the disclosed examples are also applicable to alternating current type SSPCs.

In this example, the SSPC 18 includes a logic section 32 and a power section 34. The logic section 32 includes a power supply 20, which provides power to a microcontroller 38 that controls operation of the SSPC 18. Power supply 20 is connected both to ground and to a power source 22. The microcontroller 38 interfaces with a gate drive 40 (e.g., a power MOSFET), a switch 42 (e.g., a FET), an instantaneous trip module 44, and a current limit module 46. In one example, the instantaneous trip module 44 operates in a known manner to trip the SSPC from an ON state to an OFF state in response to an electrical fault. As shown, the microcontroller 38 measures the electrical current flow through the SSPC 18 using resistor 48 and measures the voltage across the switch using line 50 connected at the switch 42. Although only one switch 42 is shown in this example, multiple switches 42 may be used in the same manner as described.

The microcontroller 38 and current limit module 46 control current through the switch 42 using the gate drive 40. For example, the microcontroller 38 and the current limit module 46 control a gate voltage in a known manner to control the current through the switch 42. In the disclosed example, the current limit module 46 includes an operational amplifier 52 that senses current and regulates the gate voltage to selectively limit the current through the switch 42, as will be described below.

The instantaneous trip module 44 includes associated instantaneous trip logic and the current limit module 46 includes an associated lightning logic. The logic is executed using software, hardware, or a combination thereof. The SSPC 18 responds in a predetermined way to a particular electrical event, depending on the magnitude of the voltage across the switch 42 and a preset instantaneous trip threshold associated with the instantaneous trip module 44.

Currents larger than the instantaneous trip threshold are possible with loads that have transient voltage suppression (e.g., shunts) or loads that are highly capacitive in nature or at faults in the load circuitry, including but not limited to the wiring. In the disclosed example, the switch 42 includes a voltage clamp circuitry that protects the switch 42 in a known manner from certain voltage transients when the SSPC 18 is in the OFF state. The voltage clamp activates in a linear region to dissipate energy to thereby absorb transient voltages above the FET breakdown voltage. For a DC application, the switch 42 thereby blocks the current to a load output (for voltages below a breakdown voltage of the switch 42) but allows current in reverse direction. For an AC application, the switch 42 thereby blocks the current relative to the load output in both directions. In the ON state and outside of the instantaneous trip threshold, the current limit module 46 and its associated logic protect the SSPC 18 from transient current without tripping to the OFF state, as will be described below.

The following examples illustrate the operation of the instantaneous trip module 44 and the current limit module 46 under various example conditions and are in no way intended to be limiting. The disclosed examples are based upon the premise that if the SSPC 18 is in the OFF state when a transient current occurs, the SSPC 18 is kept in the OFF state. If the SSPC 18 is in the ON state when a transient current occurs, the SSPC 18 stays ON and limits the transient current passing to the load to thereby protect against formation of a fusible link, destruction of the switch 42, and interruption of the current to the load, for example. The below examples are intended only to illustrate concepts of the instantaneous trip module 44 and the current limit module 46, and one of ordinary skill who is given this description will recognize application of the concepts to other examples.

Figure 2:
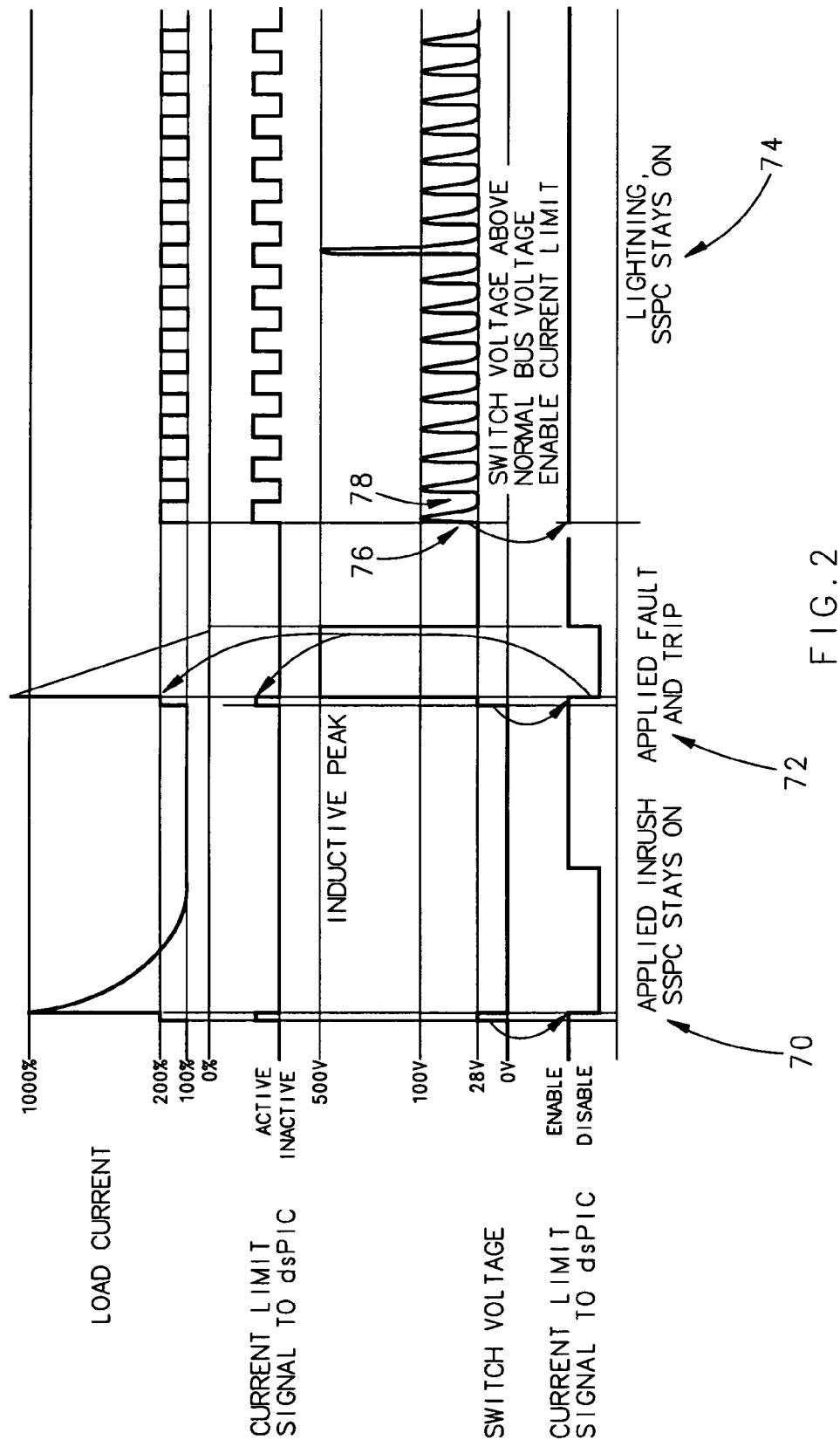
FIG. 2 illustrates examples of operation of the solid state power controller under various conditions.

FIG. 2 illustrates the operation of the SSPC 18 under various conditions. In FIG. 2, "Load Current" represents the amount of electric current passing through the switch 42. "Switch Voltage" represents the voltage across the switch 42. "Current Limit Signal to dsPIC" represents a status of a signal from the current limit module 46 to the microcontroller 38 (e.g., dsPIC) indicating whether the current limit module 46 is actively limiting the current or not. "Current Limit Enable From dsPIC" represents a status of a control signal from the microcontroller 38 to the current limit module 46 indicating whether the current limit module 46 is enabled or disabled for limiting the current.

In the disclosed examples, the microcontroller 38 determines whether the voltage across the switch 42 is within a predetermined voltage threshold. In this example, the predetermined voltage threshold is a range between 0V and 28V, which corresponds to normal and abnormal bus voltages (including transients within the power quality specification of the power source) of the SSPC 18. It is to be understood that in other examples the predetermined voltage threshold may be set for a different range or value, depending upon the normal operation of the particular SSPC or other selected parameter. When enabled, the current limit module 46 limits the current through the switch 42 to a non-zero amount when the voltage is outside of the predetermined voltage threshold.

In one example designated as 70, initially (as indicated at the left side in FIG. 2) the Switch Voltage is 0V, the Load Current is 100% (e.g., relative to a maximum rated current of the switch 42), and the current limit module 46 is enabled and inactive. Moving toward the right in FIG. 2, an applied in-rush increases the current through the SSPC 18. For example, in-rush current is typical from aircraft loads and it is desirable in this example to permit the in-rush current through the SSPC 18 without limiting the current or tripping the SSPC 18 into the OFF state. The Switch Voltage increases from 0V to 28V due to the in-rush current, and the Load Current increases. In this example, the current limit module 46 status is enabled and initially activates to thereby limit the in-rush current to 200%. However, after the microcontroller 38 determines that the Switch Voltage is within the predetermined voltage threshold, the microcontroller 38 disables the current limit module 46 such that the current limit module 46 is inactive to thereby permit the current through the switch 42. In practice, the time before the microcontroller makes the determination may be inconsequentially small. Thus, when the Switch Voltage is within a normal range as indicated by the predetermined voltage threshold, the current is allowed to pass through the switch 42.

In another example designated as 72, initially the Switch Voltage is 0V, the Load Current is 100%, and the current limit module 46 is enabled and inactive. Moving toward the right, a fault event occurs (e.g., a short) and causes the Load Current to increase above the preset instantaneous trip threshold associated with the instantaneous trip module 44. The Switch Voltage first increases from 0V to 28V and then inductively increases above 28V due to the fault event combined with the wire inductance acting as an energy storage, and the Load Current increases above 100%. In this example, the current limit module 46 status is enabled and initially activates to limit the current to 200%. However, after the microcontroller 38 and the instantaneous trip module 44 determine that the fault event has occurred, the microcontroller 38 disables the current limit module 46 and the instantaneous trip module 44 switches the SSPC 18 to the OFF state. In practice, the time before the microcontroller 38 and instantaneous trip module 44 act may be inconsequentially small. Thus, when the Load Current exceeds the preset instantaneous trip threshold, the instantaneous trip module 44 trips the SSPC 18 into the OFF state.

In another example designated as 74, a lightning event occurs and causes the Switch Voltage to periodically increase above 28V. At 76 the Switch Voltage increases above 28V. The current limit module 46 status is enabled and activates to limit the current to 200% when the Switch Voltage is above 28V. As the Switch Voltage decreases back to 28V or below, the current limit module 46 switches to the inactive state until the Switch Voltage again increases above 28V at 78. The current limit module 46 again activates to limit the current to 200% when the Switch Voltage is above 28V. Thus, when the Switch Voltage is outside of the normal range and the current limit module 46 is enabled, the current limit module 46 limits the current through the switch 42. This provides the benefit of avoiding tripping into the OFF state during the lightning event and thereby blocking lightning pulses without interrupting the load output.

The above example describes use of the current limit module 46 for DC applications, however, the concepts described can also be applied to AC applications. For example, for AC the current limit module 46 limits the current in each alternating direction through the switch 42 rather than in one direction as described above for DC.

Limiting the current to 200% of the maximum rated current of the switch 42 in the disclosed example provides the benefit of avoiding thermal overload of the SSPC 18, which may damage the SSPC 18. In this example, the limit of 200% is based upon an amount of heat expected to be produced by the switch 42 at 200% Load Current and an amount of that heat that can be removed from the switch 42 while maintaining a desired level of operation. In one example, the current limit is based upon the amount of silicon in the SSPC 18 and amount of cooling provided to the SSPC 18 to remove the heat. Therefore, the selected current limit can be varied from the disclosed example, depending upon the particular heating and cooling parameters of an SSPC.

Although a preferred embodiment of this invention has been disclosed, a worker of ordinary skill in this art would recognize that certain modifications would come within the scope of this invention. For that reason, the following claims should be studied to determine the true scope and content of this invention.

What is claimed is:

1. A method of controlling a solid state power controller, comprising:
   determining whether a voltage across a solid state power control switch is within a predetermined voltage threshold;
   limiting an electric current through the solid state power control switch to a non-zero amount of the electric current when the voltage is outside of the predetermined voltage threshold; and
   selectively disabling a current limit module that limits the electric current in the prior step in response to an in-rush current to permit the electric current through the solid state power control switch.

2. The method as recited in claim 1, including establishing the non-zero amount as a predetermined percentage of a rated current of the solid state power control switch.

3. The method as recited in claim 1, including establishing the non-zero amount based upon an amount of heat expected to be produced by the solid state power control switch at the non-zero amount.

4. The method as recited in claim 1, including establishing the non-zero amount as 200% of a rated electric current of the solid state power control switch.

5. The method as recited in claim 1, including switching the solid state power control switch from an ON state to an OFF state to block the electric current when the electric current is above a threshold electric current.

6. The method as recited in claim 1, including maintaining the solid state power control switch in an ON state to permit current through the solid state power control switch in response to limiting the electric current.

7. The method as recited in claim 1, including limiting the electric current in a first direction relative to a load, and permitting the electric current through the solid state power control switch in a second direction relative to the load for a DC waveform of the electric current.

8. The method as recited in claim 1, including limiting the electric current in a first direction relative to a load and a second, different direction relative to the load for an AC waveform of the electric current.

9. The method as recited in claim 1, including establishing the predetermined voltage threshold as a predetermined voltage range.

10. The method of claim 1, wherein said step of limiting an electric current occurs exclusively when the voltage is outside of the predetermined threshold.

11. The method of claim 1 wherein, said in-rush current comprises an in-rush current resulting from an aircraft load operation.

12. A solid state power controller system comprising:
    a switch that normally operates within a predetermined voltage threshold;
    a microcontroller that controls the switch; and
    a current limit module that controls the switch, wherein the current limit module is operative to selectively limit an electric current through the switch to a non-zero amount when a voltage across the switch is outside of the predetermined voltage threshold.

13. The system as recited in claim 12, further comprising a gate drive that interfaces with each of the microcontroller and the current limit module to selectively control the electric current through the switch.

14. The system as recited in claim 12, wherein the switch comprises a FET.

15. The system as recited in claim 12, wherein the current limit module comprises an operational amplifier.

16. The system as recited in claim 12, further comprising a gate drive having a MOSFET connected to the switch, the microcontroller, and the current limit module for controlling the electric current through the switch.

17. The system as recited in claim 16, further comprising a trip module connected with the controller and the gate drive for selectively switching the switch between an ON state and an OFF state to selectively block the electric current when the electric current is above a threshold electric current.

18. The solid state power controller system of claim 12, wherein said current limit module is operative to selectively limit the electric current through the switch to a non-zero amount exclusively when a voltage across the switch is outside of the predetermined voltage threshold.

* * * * *